United States Patent
Aman et al.

(10) Patent No.: US 7,870,462 B2
(45) Date of Patent: Jan. 11, 2011

(54) METHODS AND DEVICES FOR RANDOMIZING BURST ERRORS

(75) Inventors: Ahmad Khalid Aman, Ocean, NJ (US);
Masoud Sajadieh, Morganville, NJ (US); Mohsen Sarraf, Rumson, NJ (US); Masood Yousefi, Marlboro, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 573 days.

(21) Appl. No.: 11/797,767

(22) Filed: May 7, 2007

(65) Prior Publication Data

US 2007/0208988 A1      Sep. 6, 2007

Related U.S. Application Data

(62) Division of application No. 10/620,362, filed on Jul. 17, 2003, now Pat. No. 7,228,486.

(51) Int. Cl.
*H03M 13/00* (2006.01)
(52) U.S. Cl. .................. 714/761; 714/762; 714/701
(58) Field of Classification Search ............... 714/761, 714/762, 701
See application file for complete search history.

(56) References Cited

U.S. PATENT DOCUMENTS

| 5,321,725 | A | 6/1994 | Paik et al. |
| 5,946,357 | A | 8/1999 | Sandin et al. |
| 6,023,783 | A * | 2/2000 | Divsalar et al. ............. 714/792 |
| 6,560,362 | B1 * | 5/2003 | Piret et al. .................. 382/232 |
| 2003/0028838 | A1 | 2/2003 | Chang et al. |

FOREIGN PATENT DOCUMENTS

JP       2000-279536      10/2000

* cited by examiner

*Primary Examiner*—Jeffrey A Gaffin
*Assistant Examiner*—Guerrier Merant
(74) *Attorney, Agent, or Firm*—Capital Patent & Trademark Law Firm, PLLC

(57) ABSTRACT

Error bursts are randomized by an interleaver which makes use of "set leaders" to generate permutation indices. The permutation indices are used to route bits from initial positions in an input bit stream to re-arranged or randomized positions in an output bit stream. When the output bit stream is then transmitted and subsequently received by a de-interleaver which returns the received bits to their initial, pre-randomized positions, the resulting received signal has an acceptable bit error rate.

7 Claims, 4 Drawing Sheets

FIG. 2

| INDEX SET | LEADER 1 | LEADER 2 | LEADER 3 | LEADER 4 |
|---|---|---|---|---|
| 1 | 0 | 13 | 24 | 37 |
| 2 | 1 | 12 | 25 | 36 |
| 3 | 2 | 15 | 26 | 39 |
| 4 | 3 | 14 | 27 | 38 |
| 5 | 4 | 17 | 28 | 41 |
| 6 | 5 | 16 | 29 | 40 |
| 7 | 6 | 19 | 30 | 43 |
| 8 | 7 | 18 | 31 | 42 |
| 9 | 8 | 21 | 32 | 45 |
| 10 | 9 | 20 | 33 | 44 |
| 11 | 10 | 23 | 34 | 47 |
| 12 | 11 | 22 | 35 | 46 |

METHODS AND DEVICES FOR RANDOMIZING BURST ERRORS

CROSS-REFERENCE TO RELATED APPLICATION

The present application is a divisional of U.S. patent application Ser. No. 10/620,362 ('362 Application) filed on Jul. 17, 2003 now U.S. Pat. No. 7,228,486 and claims the benefit of priority of the '362 Application. The contents of the '362 Application is incorporated by reference herein in full, as if set forth in full herein.

BACKGROUND OF THE INVENTION

Wireless communication systems are susceptible to so-called "burst" errors (e.g., a large amount of errors are received over a very short period of time). To prevent such errors from degrading a received signal, existing techniques attempt to break-up these errors and evenly distribute them over time in a random fashion. One technique uses bit or symbol interleaving in combination with Forward Error Correction (FEC) encoding. The interleaver permutes FEC encoded bits before transmission. When these permutated bits are received by a receiver, an inverse de-interleaving is completed to restore the bit stream to its original sequence.

Conventional interleavers and de-interleavers have their drawbacks, however. Many existing interleavers/de-interleavers require the use of look-up tables that require a large number of memory elements which can be costly both in terms of money and space.

SUMMARY OF THE INVENTION

The problems with existing interleavers are avoided in accordance with the principles of the present invention by a permutation-based interleaver which generates values for sets of indices that are associated with initial positions of bits in an input bit stream. A second set of permutated indices, generated based on the values, are used to place each bit of the input bit stream into a re-arranged position in an output bit stream. In one embodiment of the invention, the re-arranged positions are randomized positions. In accordance with one aspect of the invention, the first four values may be preset to 0, 13, 24 and 37 and every remaining value can be generated based on these four initial values.

In another embodiment of the invention the interleaver is part of a wireless local area network (LAN) modem.

BRIEF DESCRIPTION OF THE DRAWINGS

FIG. 2 depicts set leader values generated in accordance with one embodiment of the present invention.

DETAILED DESCRIPTION OF THE INVENTION

There exists a set of published standards which govern interleaver/de-interleaver specifications for wireless LAN modems. One such standard is referred to as the IEEE 802.11a standard. This standard sets forth a two-step permutation process for randomizing a bit stream before it is transmitted.

More specifically, in accordance with the standard, an index i associated with an input bit stream is mapped to a permutated index j to create a randomized output bit stream using a two-step process across an entire block length, L. The first step shifts the i-th bit to the k bit location according to the following rule:

$$(k=L/16)(i \bmod 16)+\lfloor i/16 \rfloor\ i=0, 1, 2, \ldots L-1; \quad (1)$$

and the second step generates a final index, j, defined by:

$$j=s\lfloor k/s \rfloor+(k+L-\lceil 16k/L \rceil) \bmod s\ k=0, 1, 2, \ldots L-1 \quad (2)$$

where s=max (L/2, 1).

The standard set forth in equations (1) and (2) generates a per-mutated bit stream which effectively randomizes any burst errors. This permutated bit stream is then transmitted and received by a receiver which in turn returns the randomized bit stream to its initial sequence by de-interleaving the bit stream using a substantially inverse process.

Though the standard sets forth equations (1) and (2), it is silent as to how to actually build an interleaver or de-interleaver capable of implementing these equations to randomize burst errors. Some have developed interleavers/de-interleavers which require a significant amount of space on a printed circuit board due to their use of "look-up" tables which require relatively large amounts of memory elements.

In contrast, the present invention provides for techniques which do not require significantly large amounts of logic or memory elements to carry out equations (1) and (2).

To simplify the explanation of the techniques envisioned by the present invention, the following discussion will focus on methods and devices used at the transmission side of a wireless communication system (e.g., an interleaver). It should be understood that substantially the same techniques can be implemented in a de-interleaver in an inverse order at the receiving side of a wireless communication system.

Figure 1:
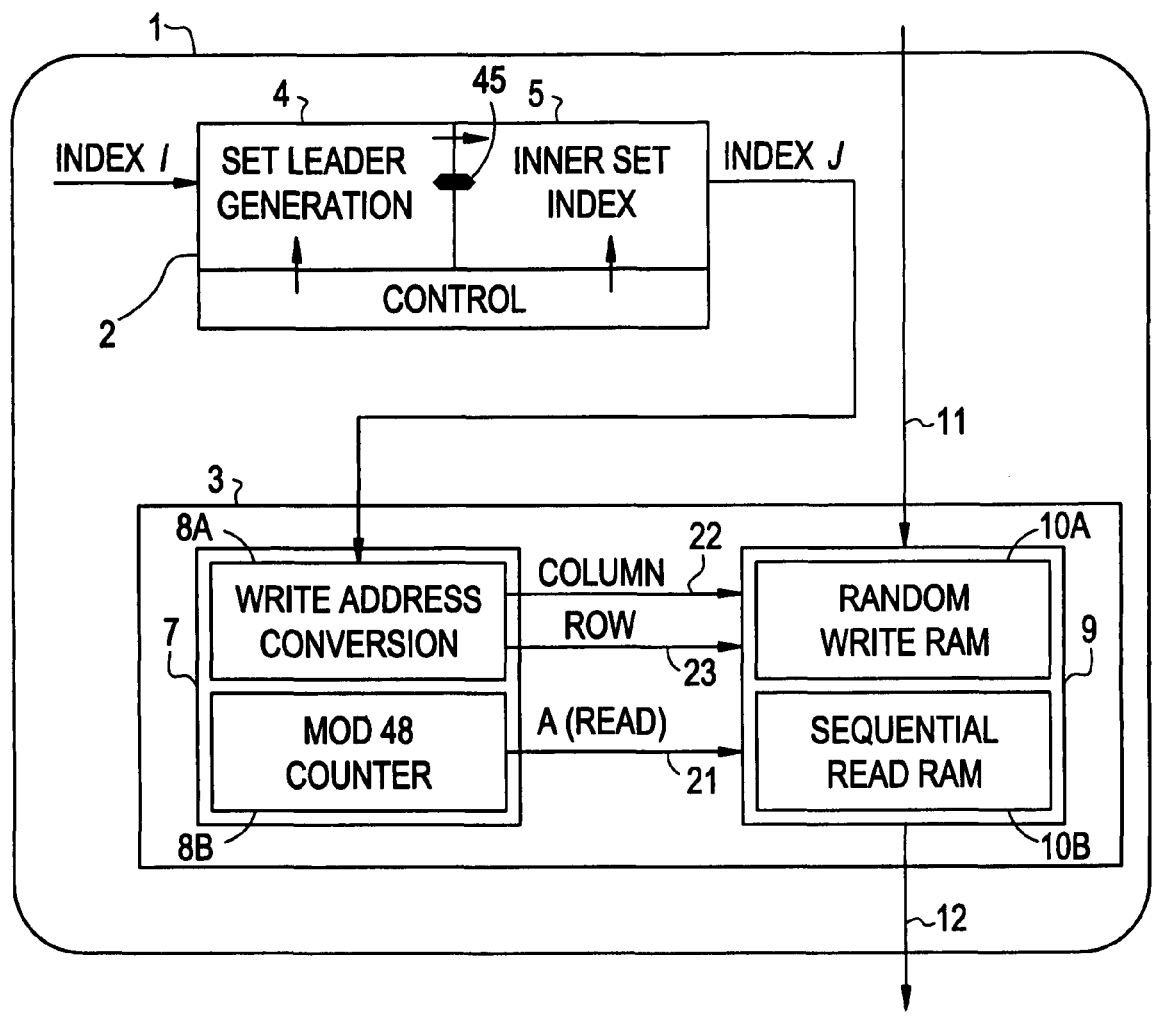
FIG. 1 depicts a simplified block diagram of a permutation-based interleaver according to one embodiment of the present invention.

Referring now to FIG. 1, there is shown a permutation-based interleaver 1 which includes a permutation index generator 2 ("generator" for short) and a bit routing unit 3 ("router" for short). As indicated by FIG. 1, the generator 2 is operable to accept an index i and to output a permutated index j. In one embodiment of the invention, the interleaver 1 may comprise a wireless LAN modem or the like.

The generator 2 further includes a set leader generation unit 4 ("set leader generator" for short), and an inner set index generation unit 5 ("inner set index generator" for short), while the bit router 3 further comprises an address section 7 and a memory section 9.

In a further embodiment of the present invention, the address section 7 further includes a WRITE address section 8A and a READ address section 8B while the memory section 9 further comprises a random WRITE memory section 10A and a sequential READ memory section 10B. In still a further embodiment, the memory sections 10A and 10B may include one or more random access memories (RAM) and the READ address section 8B may include a mod 48 counter.

Though the interleaver 1 is shown as separate units (i.e., at least sections 2 through 8), it should be understood that one or more of most of these units or sections may be combined, or, alternatively, may further be broken down into additional units or sections without departing from the spirit or scope of the present invention.

In one embodiment of the present invention, the elements of the interleaver 1 shown in FIG. 1 operate as follows. Each block of 192 incoming bits via pathway 11 must be re-arranged in a random fashion using the interleaver 1. Sometime prior to the arrival of the first bit (e.g., immediately prior to) along pathway 11, the interleaver 1 is operable to generate a permutated index j from an initial index i. The permutated index j represents the randomized order in which each block of 192 bits will be arranged upon exiting the interleaver 1 via pathway 12. The bits leaving via pathway 12 will be referred to as an "output bit stream", though it should be understood that this bit stream is ultimately fed to a transmitter which transmits or outputs the bit stream to a far-end receiver or the like. In one embodiment of the invention, the initial index i represents the original sequence of 192 bits where it is assumed for present purposes that the index of each bit matches its position within the original sequence, e.g., an index of 1 corresponds to bit 1; an index of 192 corresponds to bit 192, etc. ... To be clear, it is the indices, i, representing the incoming bits which is input into the set leader generator 4, not the bits themselves. The set leader generator 4 is operable to generate 4 "set leaders" for each set of 16 indices. Because 192 indices are involved, the set leader generator 4 is operable to generate a total of 12 sets of set leaders (i.e., 16×12=192). These set leaders are sent to the inner index generator 5 which is operable to generate a set of 16 permutated indices j for each group of 4 set leaders. Thereafter, generator 5 is further operable to output each of these permutated indices j to the bit router 3. Upon receiving the permutated indices j, the bit router 3 is operable to route a bit of an incoming bit stream received via pathway 11 to a randomized position in an outgoing bit stream output via pathway 12 using one of the permutated indices j. In a further embodiment of the invention, the bits that are output via pathway 12 represent bits from a previous block of 192 bits. That is so say, the present invention provides for outputting one bit of a previous block of bits from memory section 10B via pathway 12 each time a new incoming bit is clocked into memory section 10A via pathway 11.

In more detail, the bit router 3 is operable to store each incoming bit arriving via pathway 11 in the random WRITE memory section 10A in accordance with an associated permutated index j during a given time interval. During the same time interval, the bit router 3 is operable to output a previously stored input bit from sequential READ memory section 10B upon receiving a READ signal from the READ address section 8B. In this matter, an original input bit stream having an original index i, has its bit sequence rearranged or randomized such that the initial position of a particular bit is usually (i.e., a bit's randomized position may equate to its initial position but it is expected that this scenario would be relatively rare) not retained in the permutated, randomized output bit sequence. Instead, each bit is assigned a position in an output bit stream according to a permutated index j.

The WRITE address section 8A is operable to store each bit of the input bit stream received via pathway 11 in a column or row of the memory section 10A in accordance with the permutated index j. Subsequently, each of the stored input bits is sequentially read out of memory section 10B.

FIG. 2 depicts set leader values which are generated by the set leader generation unit 4 in accordance with one embodiment of the present invention. Upon studying the application of equations (1) and (2) to initial indices i, the present inventors discovered an interrelationship between equations (1) and (2), which heretofore, had gone undiscovered. This interrelationship is illustrated by the generation of the set leader values ("set leaders" for short) shown in FIG. 2.

For every block of 192 bits, the set leader generator 4 decomposes an associated index i into twelve sets of sixteen indices. It should be understood that each subsequent block of 192 bits will use the same set leaders shown FIG. 2. Before now this repetitive pattern of set leaders was unknown. Unaware of such a pattern, existing techniques must use lots of memory elements, and, consequently, lots of space on a printed circuit board or the like. Armed with knowledge of such a pattern, the number of memory elements can be significantly reduced. In one embodiment of the invention, it is only necessary to preset (e.g., pre-program) the set leader generator 4 with the values of the first four set leaders. Thereafter, all of the other set leader values shown in FIG. 2 may be generated from these first four values. Though the first four set leader values are pre-set, these values will also be described as being "generated" by the generator 4.

Continuing, referring to FIG. 2, the first four received indices i of each set are designated as set leaders, i.e., Leader 1, Leader 2, Leader 3 and Leader 4. When two adjacent rows in FIG. 2 are compared, it can be seen that the second and all subsequent rows of set leader values may be calculated after being supplied with the first set leader values. More specifically, the first group of set leaders are shown along the first row and are designated as having the values 0, 13, 24, and 37. Each subsequent row represents the next group of set leaders associated with the next group of 16 indices i. In one embodiment of the present invention, the set leader generator 4 is operable to generate each subsequent row of set leader values as follows. The generator 4 is operable to generate the first subsequent set leader (designated as "Leader 1") occupying column 1, row 2 by simply incrementing the first set leader value in column 1, row 1 by one. As can be seen in FIG. 2, the values in column 1 increase sequentially by one, from a value of zero up to eleven. The generation of all of the third set leader values (designated by the notation "Leader 3" in column 3) follows the same pattern, that is, the generator 4 is operable to increment the initial set leader value of 24 shown in column 3, row 1 by one. In FIG. 2, the initial value for set Leader 3 increases by one from a value of 24 up to 35.

With respect to the generation of the values associated with set Leader Numbers 2 and 4 (columns 2 and 4 in FIG. 2), the generator 4 is operable to decrement an initial value and any subsequent values by one, or increment an initial value or any subsequent value by three, to generate all of the subsequent set leader values associated with Leaders 2 and 4. For example, referring to column 2, under the heading "Leader 2", it can be seen that the initial value is 13 and all subsequent values are generated by either decreasing this initial value or any subsequent values by one (e.g., to 12 as shown in row 2, column 2) or increasing this initial value or any subsequent value by three (e.g., to 15 as shown in column 2, row 3). Again, this "decrement by one/increment by three" pattern is applied to the generation of values associated with both set Leaders 2 and 4 shown in columns 2 and 4 of FIG. 2. It should be understood that the values in each row of FIG. 2 are associated with a group of 16 indices i. Ultimately, it is these values which will be used by the inner set index generator 5 to generate permutated indices j.

Once the set leader values shown in FIG. 2 have been generated by generator 4, generator 4 is further operable to forward the values to the inner set generator 5 via pathway 45. In one embodiment of the present invention, the inner set generator 5 is operable to generate a set of 16 indices j upon receiving every set of 4 set leader values. Because there will be 12 different sets of set leader values sent to generator 5, generator 5 is operable to generate a total of 192 indices j. It is these 192 indices j which are sent to the bit routing unit 3 in order to randomize or re-arrange the sequence of bits arriving via pathway 11. In an embodiment of the present invention, the bit router 3 is operable to route each input bit arriving via pathway 11 to a position in memory section 9 in accordance with an index j Subsequently, when each of these so routed bits are output via pathway 12, their respective positions in an output bit sequence will be randomized or re-arranged compared to their initial position before being transmitted by a transmitter or the like.

Figure 3:
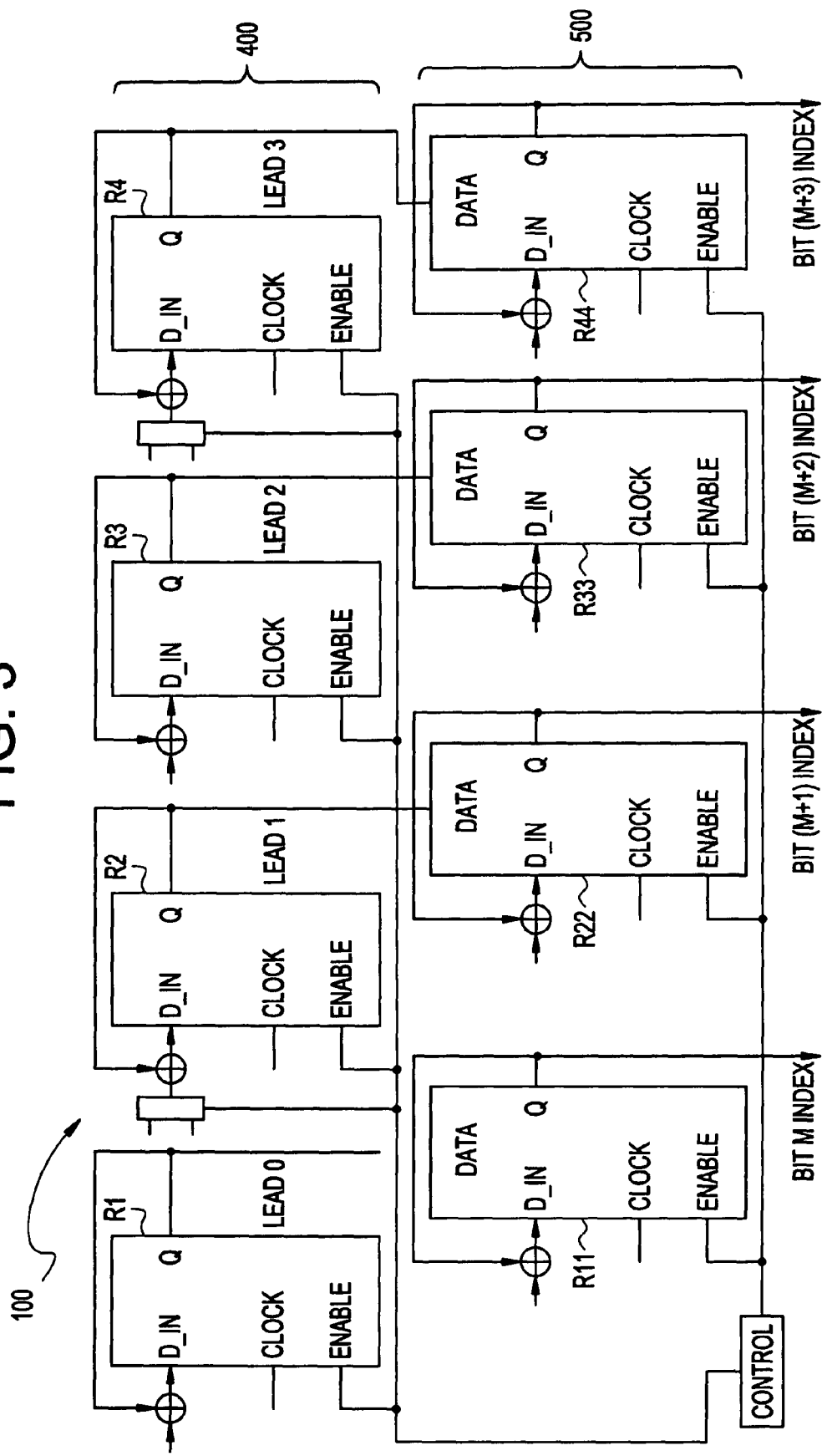
FIG. 3 depicts another block diagram of a permutation-based interleaver according to yet another embodiment of the present invention.

FIG. 3 depicts another block diagram of a permutation-based interleaver 100 according to yet another embodiment of the present invention. As shown, registers R1-R4 include a set leader generator 400 while registers R11-R44 include an inner set index generator 500. The output of the inner set generator 500 is permutated index j, with each of the bits designated as M, M+1, M+2, M+3, ... M+n. Each register R1-R4 and R11-R44 may include a D flip-flop or the like.

Figure 4:
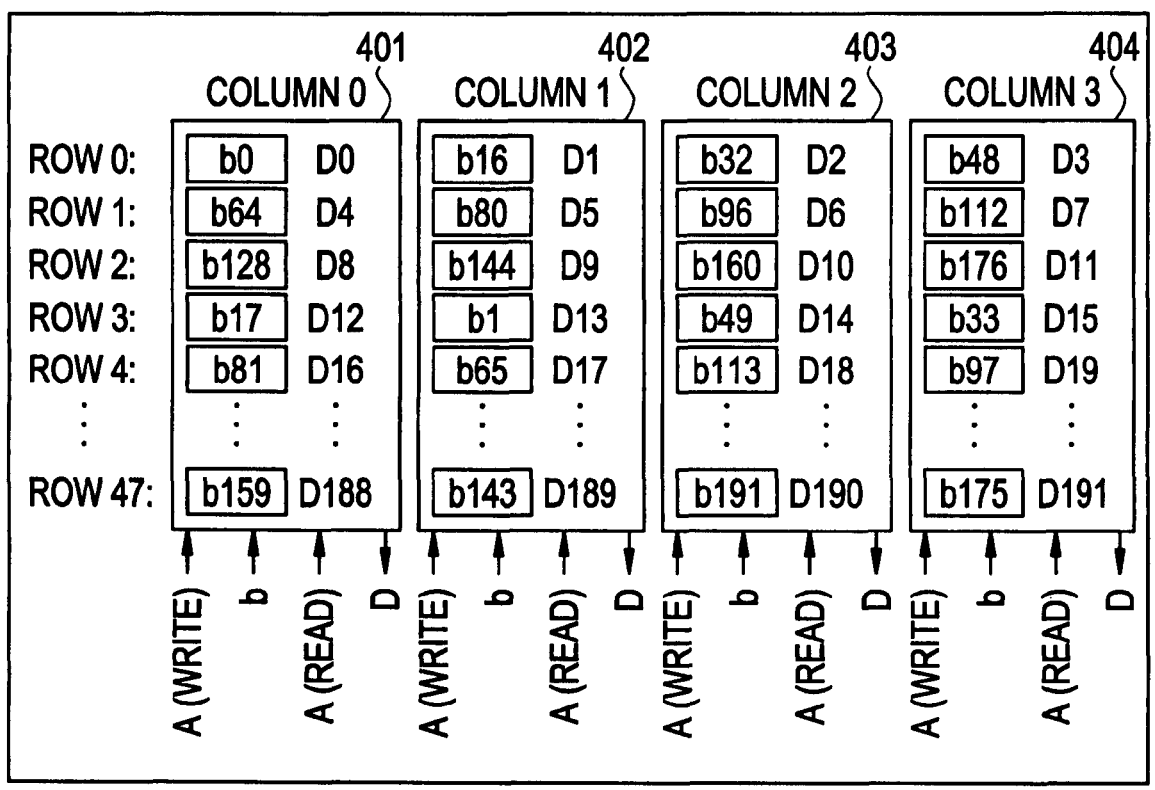
FIG. 4 depicts an addressable memory section according to one embodiment of the present invention.

Referring to FIG. 4, there is shown another embodiment of the addressable memory section 9. More particularly, section 9 may include memory elements 401-404, each operable to store each bit of the input bit stream into a position in memory associated with the permutated index j.

The four memory blocks 401-404 are accessed in parallel to WRITE the input bits using, for example, an 8-bit address and at the same time, to READ the permutated output bits addressed by a different 8-bit address. The parallel input of bits allows for the treatment of at least 4-bit words during each clock cycle in order to keep up with input requirements. To be able to handle four bits, the present invention envisions that the WRITE unit 8A is operable to convert each of the permutated indices j into a column number and "A" addresses (see FIG. 4). In an illustrated embodiment of the present invention, if the permutated index of a certain input bit is j, then the memory block where an associated input bit will be stored is identified by:

Column number=j mod 4 and the location in that block is obtained from:

A(WRITE)=row number=[j/4].

Referring to FIG. 4, consider an input bit b1, for example, where this is the second bit of a sequence of bits beginning with b0. From FIG. 2, the set leader value for this bit is 13 (first row, second column). Using this value, generator 5 will generate an index j and the bit router 3 will route the first bit b1 to a location associated with memory block 402 (e.g., location D13).

Thereafter, each of the stored input bits b is sequentially read out of memory section 10B using, for example, a 4-bit READ address generated by the READ address unit 8B. It should be further understood that the memory sections 10A and 110B include two non-overlapping segments of memory section 9. In the case where memory section 9 includes a RAM, it can be said that memory section 9 includes a dual-port RAM. In a further embodiment of the present invention, this overlapping allows for the delay of one interleaved block to be introduced between bits that are input into the memory section 9 and bits that are output as discussed above.

As indicated initially, the discussion above has focused on an interleaver, though substantially the same techniques applied in an inverse order may be used to build a de-interleaver or otherwise carry out de-interleaving. It should be noted, however, that the discussion above was intended to point out some of the examples envisioned by the present invention. It is next to impossible to set forth all of the examples so envisioned. Alternative embodiments may be thought of without departing from the present invention, the scope of which is better defined by the claims which follow.

We claim:

1. A method for randomizing burst errors comprising the steps of:
    generating a number of set leader values, where the number is a multiple of four, for a set of initial indices, wherein each index within the initial set of indices is associated with an initial position of a bit in an input bit stream;
    generating a permutated index for each initial index based on the set leader values; and
    routing each bit in the input bit stream to a randomized position in an output bit stream in accordance with its permutated index.

2. The method as in claim 1 further comprising the steps of generating four set leader values for each set of sixteen initial indices and generating sixteen permutated indices for each four set leader values.

3. The method as in claim 1 further comprising routing input bits from an input bit stream to randomized positions in an output bit stream using the permutated indices.

4. The method as in claim 1 further comprising generating a group of subsequent set leader values from four preset set leader values of 0, 13, 24 and 37.

5. The method as in claim 4 further comprising generating the subsequent set leader values by repeatedly incrementing a first set leader value by 1, repeatedly decrementing a second set leader value by one, or incrementing the second value by three, repeatedly incrementing a third set leader value by one and repeatedly decrementing a fourth set leader value by one, or incrementing the fourth value by three.

6. The method as in claim 1, wherein the set leader values generated by the set leader generation unit are given by:

| Index Set | Leader 1 | Leader 2 | Leader 3 | Leader 4 |
|---|---|---|---|---|
| 1 | 0 | 13 | 24 | 37 |
| 2 | 1 | 12 | 25 | 36 |
| 3 | 2 | 15 | 26 | 39 |
| 4 | 3 | 14 | 27 | 38 |
| 5 | 4 | 17 | 28 | 41 |
| 6 | 5 | 16 | 29 | 40 |
| 7 | 6 | 19 | 30 | 43 |
| 8 | 7 | 18 | 31 | 42 |
| 9 | 8 | 21 | 32 | 45 |
| 10 | 9 | 20 | 33 | 44 |
| 11 | 10 | 23 | 34 | 47 |
| 12 | 11 | 22 | 35 | 46. |

7. A method for randomizing burst errors comprising routing randomly positioned bits in a received bit stream to initial positions in an output bit stream based on permutated indices, wherein each randomly positioned bit was positioned based on a permutated index generated from a number of set leader values, where the number is a multiple of four.

* * * * *